United States Patent
Oshiyama

(10) Patent No.: US 10,685,720 B2
(45) Date of Patent: Jun. 16, 2020

(54) MEMORY SYSTEM

(71) Applicant: TOSHIBA MEMORY CORPORATION, Minato-ku (JP)

(72) Inventor: Naoto Oshiyama, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/418,422

(22) Filed: May 21, 2019

(65) Prior Publication Data
US 2020/0066357 A1 Feb. 27, 2020

(30) Foreign Application Priority Data
Aug. 21, 2018 (JP) .................. 2018-154833

(51) Int. Cl.
| | | |
|---|---|---|
| G11C 16/26 | (2006.01) | |
| G06F 3/06 | (2006.01) | |
| G11C 16/10 | (2006.01) | |
| G11C 16/34 | (2006.01) | |
| G11C 16/08 | (2006.01) | |
| G06F 12/02 | (2006.01) | |

(52) U.S. Cl.
CPC ............ *G11C 16/26* (2013.01); *G06F 3/0688* (2013.01); *G06F 12/0246* (2013.01); *G11C 16/08* (2013.01); *G11C 16/10* (2013.01); *G11C 16/3431* (2013.01)

(58) Field of Classification Search
CPC ......... G11C 16/26; G11C 16/08; G11C 16/10; G11C 16/3431; G06F 3/0688; G06F 12/0246
USPC ..................................................... 365/230.01
See application file for complete search history.

(56) References Cited

U.S. PATENT DOCUMENTS

| | | | |
|---|---|---|---|
| 9,594,785 B2 | 3/2017 | Sasaki | |
| 9,703,669 B2* | 7/2017 | Lampert | ............ G06F 11/3024 |
| 2012/0137046 A1* | 5/2012 | Tak | .......... G11C 8/12 |
| | | | 711/102 |
| 2014/0098600 A1 | 4/2014 | Kim et al. | |
| 2017/0117030 A1* | 4/2017 | Fisch | .................... G11C 11/406 |
| 2018/0081928 A1* | 3/2018 | Ushijima | ................ G06F 12/10 |
| 2019/0342513 A1* | 11/2019 | Doege | .................. H04N 5/3456 |

FOREIGN PATENT DOCUMENTS

| | | |
|---|---|---|
| JP | 2012-146129 | 8/2012 |
| WO | WO 2012/081165 A1 | 6/2012 |

\* cited by examiner

*Primary Examiner* — Fernando Hidalgo
(74) *Attorney, Agent, or Firm* — Oblon, McClelland, Maier & Neustadt, L.L.P.

(57) ABSTRACT

According to one embodiment, a non-volatile first memory includes a plurality of first storage areas. A second memory stores a plurality of first addresses each is address information of a second storage area. The second storage area is a first storage area in a first state. A third memory stores a counted value for the second storage area. A determiner circuit reads, at a time of a read access to the first memory, at least one of the first addresses and compares the read second address with a third address to determine whether a third storage area is in the first state. The third address indicates a location of the third storage area. The third storage area is a first storage area to be read. An update circuit increments, for the third storage area, the counted value, when the third storage area is in the first state.

13 Claims, 10 Drawing Sheets

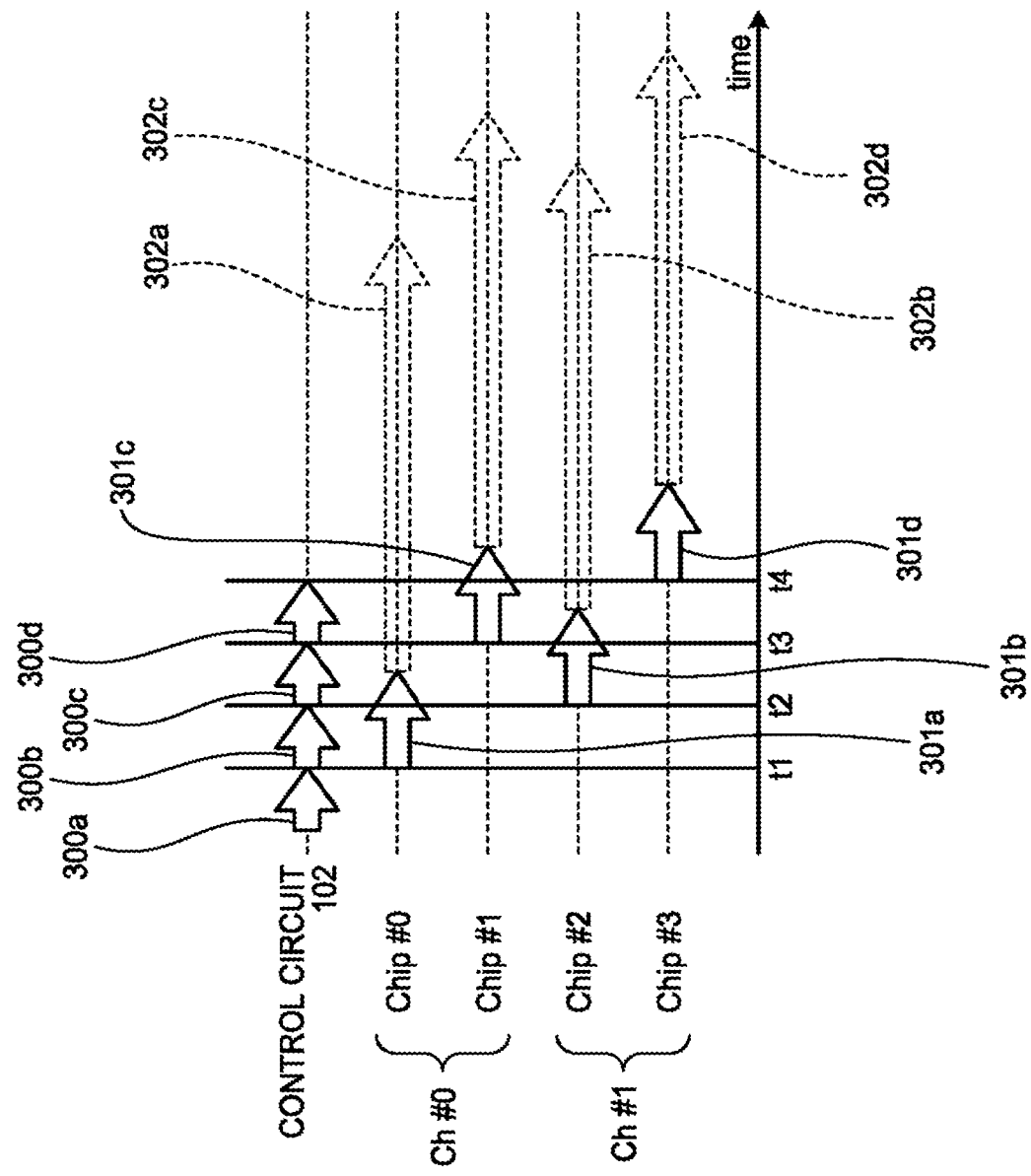

FIG.6

| Entry No. | BLK_RAM 420 | | Entry No. | COUNT_RAM 430 |
|---|---|---|---|---|
| 0 | PHYSICAL ADDRESS_0 | Chip #0, Plane #0 | 0 | COUNTED VALUE (PHYSICAL ADDRESS_0) |
| 1 | PHYSICAL ADDRESS_1 | | 1 | COUNTED VALUE (PHYSICAL ADDRESS_1) |
| 2 | PHYSICAL ADDRESS_2 | | 2 | COUNTED VALUE (PHYSICAL ADDRESS_2) |
| 3 | PHYSICAL ADDRESS_3 | Chip #1, Plane #0 | 3 | COUNTED VALUE (PHYSICAL ADDRESS_3) |
| 4 | PHYSICAL ADDRESS_4 | | 4 | COUNTED VALUE (PHYSICAL ADDRESS_4) |
| 5 | PHYSICAL ADDRESS_5 | | 5 | COUNTED VALUE (PHYSICAL ADDRESS_5) |
| 6 | PHYSICAL ADDRESS_6 | Chip #2, Plane #0 | 6 | COUNTED VALUE (PHYSICAL ADDRESS_6) |
| 7 | PHYSICAL ADDRESS_7 | | 7 | COUNTED VALUE (PHYSICAL ADDRESS_7) |
| 8 | PHYSICAL ADDRESS_8 | | 8 | COUNTED VALUE (PHYSICAL ADDRESS_8) |
| N-2 | PHYSICAL ADDRESS_N-2 | Chip #3, Plane #0 | N-2 | COUNTED VALUE (PHYSICAL ADDRESS_N-2) |
| N-1 | PHYSICAL ADDRESS_N-1 | | N-1 | COUNTED VALUE (PHYSICAL ADDRESS_N-1) |

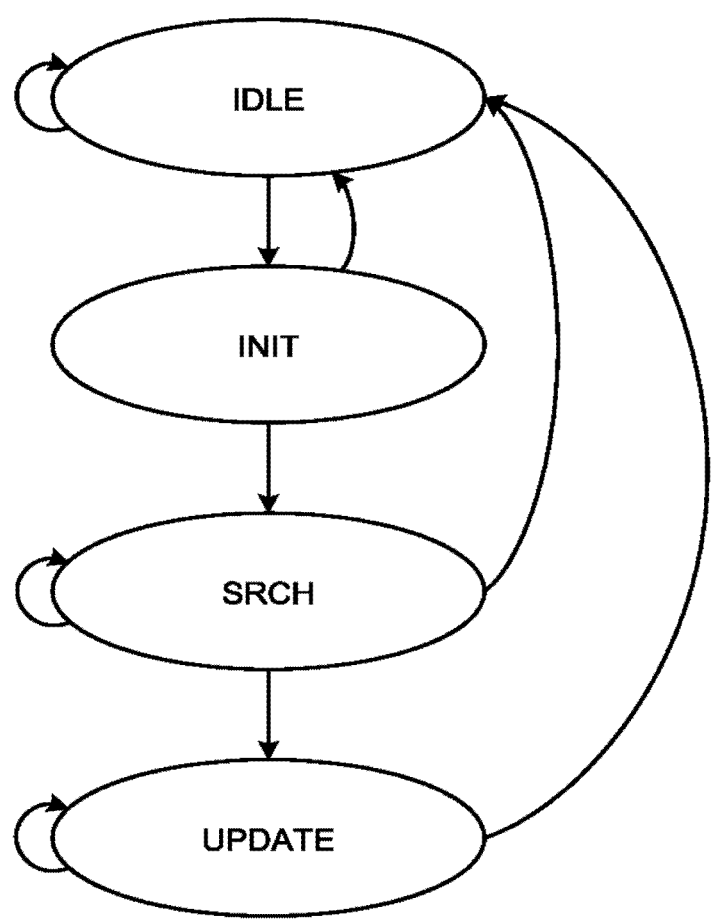

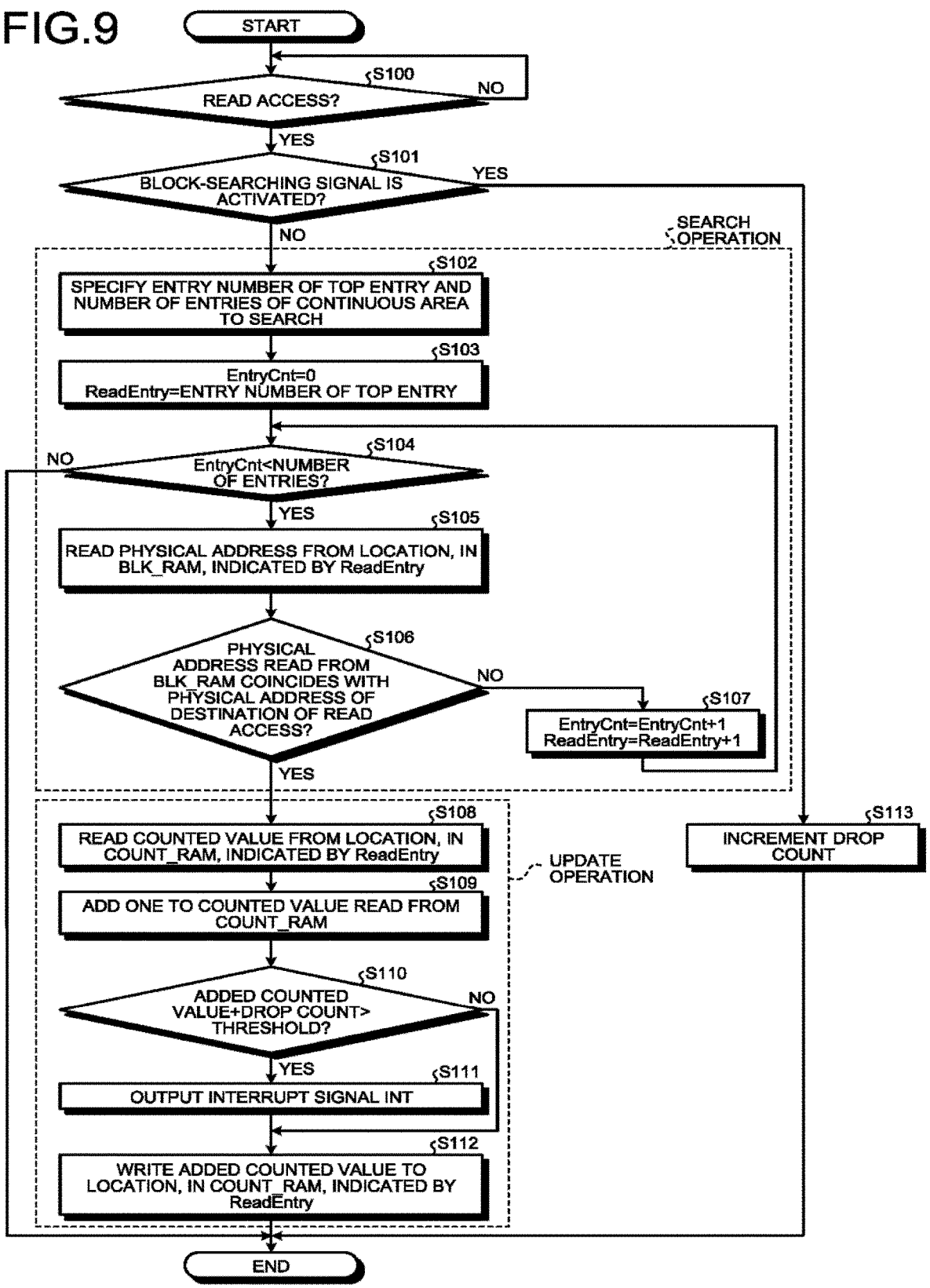

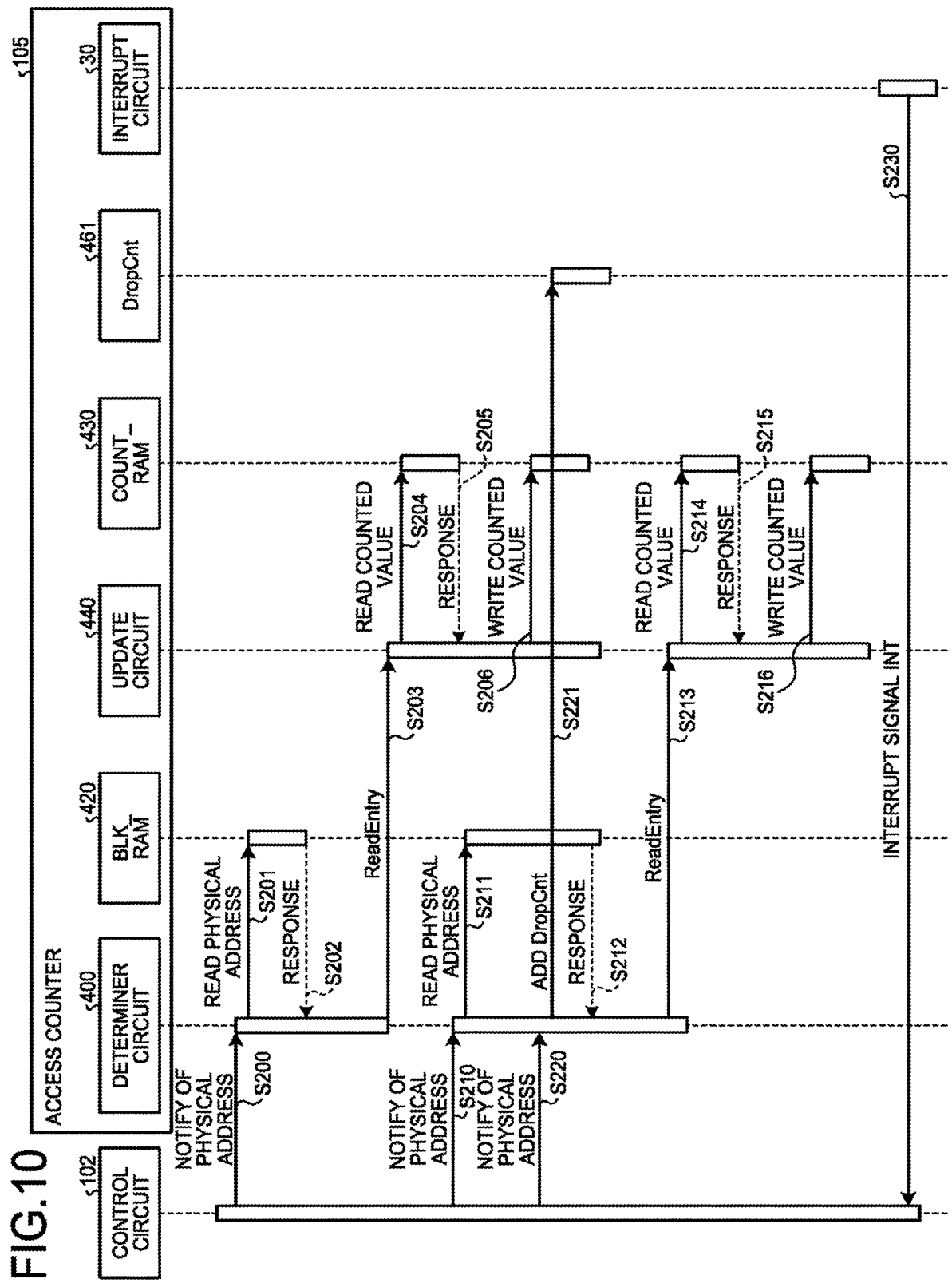

US 10,685,720 B2

MEMORY SYSTEM

CROSS-REFERENCE TO RELATED APPLICATIONS

This application is based upon and claims the benefit of priority from Japanese Patent Application No. 2018-154833, filed on Aug. 21, 2018; the entire contents of which are incorporated herein by reference.

FIELD

Embodiments described herein relate generally to a memory system.

BACKGROUND

Memory systems incorporating a NAND flash memory (NAND memory) are available. A phenomenon called read disturb in a NAND memory that a read operation to the NAND memory leads to lowering the reliability of data stored in a memory cell near a read position, is known.

BRIEF DESCRIPTION OF THE DRAWINGS

FIG. 5 is a diagram illustrating an example of the number of elements where read is simultaneously started, according to the first embodiment;

FIG. 6 is a diagram illustrating an example of information that is stored in a block RAM and a counter RAM according to the first embodiment;

FIG. 7 is a diagram illustrating an example of state transition of a state machine according to the first embodiment;

FIG. 9 is a flowchart illustrating exemplary operation of the access counter according to the first embodiment; and FIG. 10 is a sequence diagram illustrating exemplary operation of an access counter according to a second embodiment.

DETAILED DESCRIPTION

In general, according to one embodiment, a memory system includes a non-volatile first memory, and at least one first counter circuit. The non-volatile first memory includes a plurality of first storage areas. The first counter circuit includes a second memory, a third memory, a determiner circuit, and an update circuit. The second memory is configured to store a plurality of first addresses. Each of the first addresses is address information of a second storage area. The second storage area is a first storage area in a first state. The third memory is configured to store a first counted value for the second storage area. The determiner circuit is configured to read, at a time of a read access to the non-volatile first memory, at least one of the first addresses from the second memory and compare a second address with a third address to determine whether or not a third storage area is in the first state. The second address is a first address read from the second memory. The third address is address information indicating a location of the third storage area. The third storage area is a first storage area to be a destination of the read access. The update circuit is configured to increment, for the third storage area, the first counted value stored in the third memory, when the determiner circuit determines that the third storage area is in the first state.

Exemplary embodiments of the memory system will be explained below in detail with reference to the accompanying drawings. The embodiments are merely exemplary and not intended to limit the scope of the present invention.

First Embodiment

Figure 1:
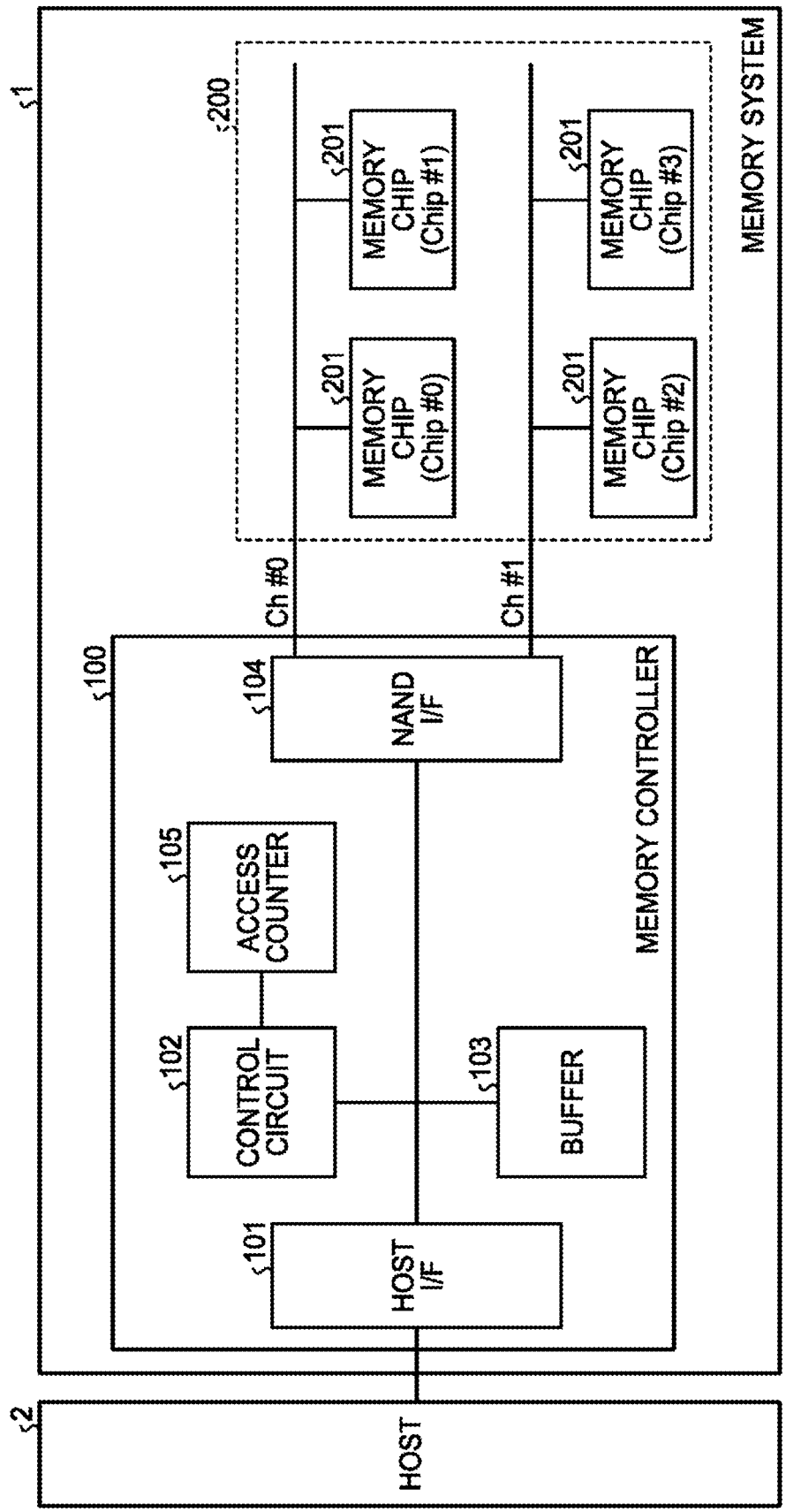
FIG. 1 is a diagram illustrating an exemplary configuration of a memory system according to a first embodiment.

FIG. 1 is a diagram illustrating an exemplary configuration of a memory system according to a first embodiment. A memory system 1 is connected to a host 2 through a certain communication interface. For example, the host represents a personal computer, a portable information terminal, or a server. The memory system 1 can receive access requests such as a read request and a write request from the host 2. Each access request includes a logical address designating an access destination. The logical address refers to address information indicating a location in a logical address space provided by the memory system 1 to the host 2. The memory system 1 receives data to write together with a write request.

The memory system 1 includes a memory controller 100, and a NAND flash memory (NAND memory) 200. The memory system 1 may include any non-volatile memory instead of the NAND memory 200. For example, the memory system 1 may include a NOR flash memory instead of the NAND memory 200.

The NAND memory 200 includes at least one memory chip 201. In the first embodiment the NAND memory 200 includes four memory chips 201 by way of example. Each memory chip 201 may be identified by a chip number. To distinguish among the memory chips 201, the memory chips 201 are denoted by Chip #0 to Chip #3 with chip numbers 0 to 3.

The NAND memory 200 is connected to the memory controller 100 via one or more channels. The NAND memory 200 and the memory controller 100 are connected via two channels (Ch #0, Ch #1) by way of example.

More specifically, Chip #0 and Chip #1 are connected to channel #0(Ch #0), and Chip #2 and Chip #3 are connected to channel #1 (Ch #1). The memory controller 100 separately controls channel #0 and channel #1.

Figure 2:
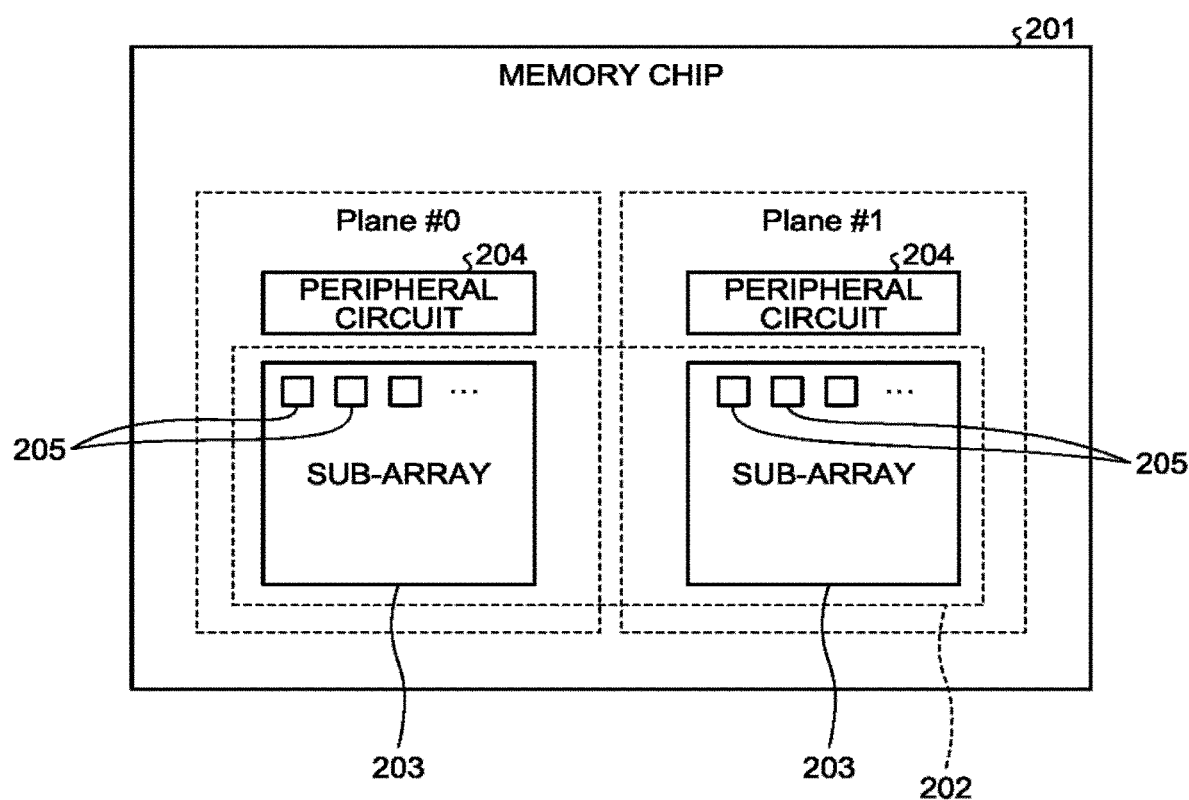
FIG. 2 is a schematic and illustrative diagram illustrating a configuration of a memory chip according to the first embodiment.

FIG. 2 is a schematic and illustrative diagram of the configuration of the memory chip 201 according to the first embodiment.

As illustrated in FIG. 2, the memory chip 201 includes a memory cell array 202 divided into two sub-arrays 203, and two peripheral circuits 204. Each sub-array 203 is paired with one of the two peripheral circuits 204. The pair of the sub-array 203 and the peripheral circuit 204 is referred to as a plane. Each plane in each memory chip 201 is identified by a plane number.

Herein, one of the two planes in each memory chip 201 is denoted by Plane #0 with a plane number 0. The other of the two planes provided in each memory chip 201 is denoted by Plane #1 with a plane number 1.

Each sub-array 203 includes a plurality of blocks 205. Each block 205 is a minimum unit of storage area as a subject of erase operation. That is, all the data stored in one block 205 are collectively erased. Each block 205 includes a plurality of pages. The Page is a storage area from and to which data can be collectively read and written.

The peripheral circuit 204 includes, for example, a row decoder, a column decoder, a sense amplifier, and a page buffer. The peripheral circuit 204 is provided in each of the two planes, so that the two planes are independently readable.

In the first embodiment, read operation to the two planes of one memory chip 201 can start at the same timing. Such concurrent start of reading from a plurality of planes of one memory chip 201 may be referred to as a multi-plane read. In the case of executing the multi-plane read, the physical addresses of access destinations of respective planes may be designated by one read command.

The number of planes in the memory chip 201 is not limited to two.

Figure 3:
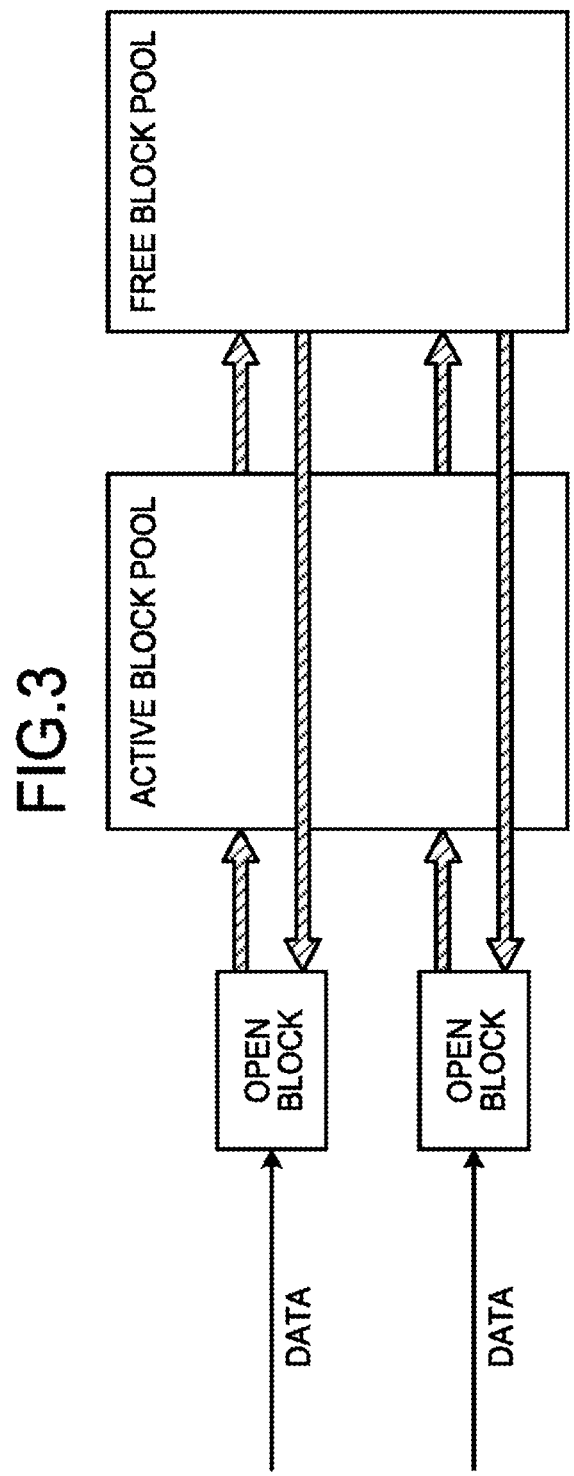
FIG. 3 is a diagram illustrating an example of state transition of a block according to the first embodiment.

Now, state transition of the blocks will be described. FIG. 3 is a diagram illustrating an example of state transition of the blocks according to the first embodiment. Hatched arrows indicate the state transition of the blocks, and solid arrows indicate a flow of data.

States of the blocks include at least open, active, and free. One or more active blocks constitute an active block pool, and one or more free blocks constitute a free block pool.

An open block refers to a block to which data is being written. That is, the open block is a block in a state in which an available area remains. The available area means an area to which data can be written.

An active block refers to a block riot ready for reuse, among blocks in which data write is completed. Among the blocks where data write is completed, a block containing valid user data is managed as the active block. Reuse refers to transition of a block to the open block.

A free block refers to a block containing no valid user data. The free block is a reusable block.

After one block data is written to an open block, for example, the open block transitions to an active block. The written data stored in the active block is either valid or invalid.

When second data is transmitted from the host 2 designating the same logical address as the logical address of first data stored in the active block, the memory controller 100 writes the second data on a free page of the open block, and manages the first data stored in the active block as invalid data.

The active block transitions to a free block through garbage collection. Garbage collection refers to an operation for transcribing valid data from an active block to another open block to invalidate all the data stored in the block being a transcription source. The block being a transcription source thereby transitions from an active block to a free block.

The free block transitions to an open block after data stored therein is erased.

Valid data means that a physical address of a location of stored data is associated with a logical address in a logical-physical address conversion table, as described later. Invalid data means that a physical address of a location of stored data is not associated with any logical address in the logical-physical address conversion table. The term, "free" means that the block stores no invalid or valid data. That is, a free page refers to a free area to which data can be written.

Refer back to FIG. 1. The memory controller 100 includes a host interface (I/F) 101, a control circuit 102, a buffer 103, a NAND interface (I/F) 104, and an access counter 105. For example, the memory controller 100 may be configured as a System-On-a-Chip (SoC). These elements are driven by a clock supplied from a clock generator circuit (not illustrated). The functions of the memory controller 100 may be implemented by hardware, software, or a combination thereof.

The buffer 103 represents a memory that buffers data transferred between the host 2 and the NAND memory 200, and management information. The management information includes the logical-physical address conversion table, for example.

The logical-physical address conversion table refers to information for associating address information indicating a location in a logical address space (logical address) provided by the memory system 1 to the host 2, and address information indicating a physical location in the NAND memory 200 (physical address), more specifically, a location in the memory cell array 202. In writing data multiple times to a certain logical address, association between the logical address and the physical address is dynamically changeable by updating the logical-physical address conversion table, so as to prevent the certain location in the NAND memory 200 from becoming worn out.

The type of memories of the buffer 103 is not limited to a specific type. For example, the buffer 103 may be a dynamic random access memory (DRAM), a static random access memory (SRAM), or a combination of the two.

The host interface 101 controls a communication interface between the host 2 and the memory system 1. The host interface 101 transfers data between the host 2 and the buffer 103 under the control of the control circuit 102. The NAND interface 104 transfers data between the NAND memory 200 and the buffer 103 under the control of the control circuit 102.

The control circuit 102 includes a hardware circuit such as a central processing unit (CPU), a field-programmable gate array (FPGA), or an application specific integrated circuit (ASIC). The control circuit 102 represents a hardware circuit that implements data transfer between the host 2 and the NAND memory 200 by controlling the host interface 101 and the NAND interface 104.

To write data stored in the buffer 103 to the NAND memory 200, for example, the control circuit 102 designates the physical address of a write destination, and instructs the NAND interface 104 to write the data to the NAND memory 200. The NAND interface 104 performs write access to the NAND memory 200 based on the instruction from the control circuit 102.

To read data from the NAND memory 200, the control circuit 102 designates the physical address of a read source, and transmits an instruction to read the data to the NAND interface 104. The NAND interface 104 performs a read access to the NAND memory 200 in response to the instruction from the control circuit 102.

Thus, the control circuit 102 can access the NAND memory 200 by controlling the NAND interface 104. The control circuit 102 may access the NAND memory 200 in response to an access request from the host 2, and may also access the NAND memory 200 as part of internal processing, that is, part of processing to be performed regardless of an access request from the host 2.

The internal processing includes reading data from one block and writing the data to another block (i.e., transcription operation). The transcription operation includes the garbage collection for collecting only valid data from blocks, wear leveling for transferring data so as to equalize the number of rewrites, and refresh operation for writing over data with lower reliability, for example.

For a read access to the NAND memory 200, the control circuit 102 notifies the access counter 105 of the physical address designating an access destination.

The access counter 105 counts the number of read accesses to a certain block.

After the read operation to the NAND memory, the reliability of data stored in a memory cell near the read location is degraded (called a read disturb). Particularly, a certain number or more of read accesses to an open block deteriorates the erase state of a free word line in the open block. A write access to the word line in the deteriorated erase state might increase a bit error ratio.

In view of this, in the first embodiment, the number of read accesses to each open block is counted to determine whether to execute a refresh operation for recovering data reliability, using the counted value.

Figure 4:
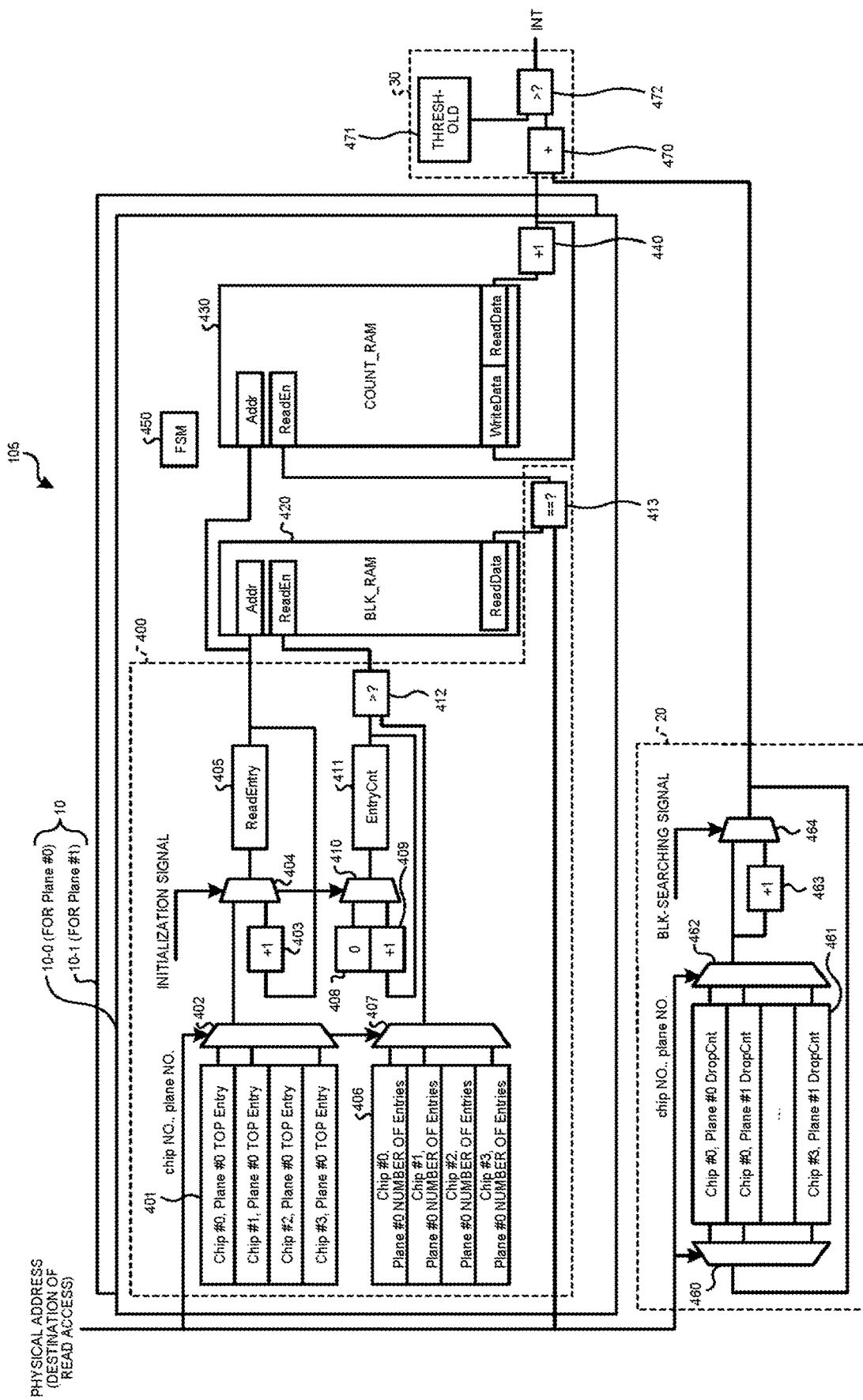
FIG. 4 is a diagram illustrating an exemplary configuration of an access counter according to the first embodiment.

FIG. 4 is a diagram illustrating an exemplary configuration of the access counter 105 according to the first embodiment. As illustrated in the FIG. 4, the access counter 105 includes a plurality of first counter circuits 10, a second counter circuit 20, and an interrupt generation circuit 30.

The number of first counter circuits 10 in the access counter 105 is equal to the maximum number of elements which can simultaneously tart reading.

FIG. 5 is a diagram illustrating an example of the number of elements which simultaneously start reading, according to the first embodiment. For example, the control circuit 102 can serially perform an operation 300a, an operation 300b, an operation 300c, and an operation 300d. Each of the operation 300a, the operation 300b, the operation 300c, and the operation 300d is for requesting a read access.

In the operation 300a, the control circuit 102 determines a read access to Chip #0 connected to the channel #0, and instructs the NAND interface 104 to perform a read access thereto at time t1. In response to the instruction, the NAND interface 104 transmits a read command to Chip #0 (operation 301a). In Chip #0, data is read from the memory cell array 202 in accordance with the read command (operation 302a).

In the operation 300b, the control circuit 102 determines a read access to Chip #2 connected to the channel #1, and instructs the NAND interface 104 to perform a read access thereto at time t2. In response to the instruction, the NAND interface 104 transmits a read command to Chip #2 (operation 301b). In Chip #2, data is read from the memory cell array 202 in accordance with the read command (operation 302b).

In the operation 300c, the control circuit 102 determines a read access to Chip #1 connected to the channel #0, and instructs the NAND interface 104 to perform a read access thereto at time t3. In response to the instruction, the HAND interface 104 transmits a read command to Chip #1 (operation 301c). In Chip #1, data is read from the memory cell array 202 in accordance with the read command (operation 302c).

In the operation 300d, the control circuit 102 determines a read access to Chip #3 connected to the channel #1, and instructs the NAND interface 104 to perform a read access at time t4. In response to the instruction, the NAND interface 104 transmits a read command to Chip #3 (operation 1d). In Chip #3, data is read from the memory cell array 202 in accordance with the read command (operation 302d).

The read commands transmitted through the operations 301a to 301d may be multi-plane read commands. In response to reception of a multi-plane read command, read operations to two planes f the corresponding memory chip 201 are simultaneously started.

In the example in FIG. 5, as described above, read commands are transmitted to the memory chips 201 at different timings. Each read command may be a multi-plane read command. In FIG. 5, thus, the two planes of one memory chip 201 are elements which can simultaneously start read operation. That is, the number of elements to be able to simultaneously start reading is two.

If the number of planes in one memory chip 201 is given as N where N is a natural number two or more, read operations to the N planes can be concurrently started at the maximum by a multi-plane read. That is, in such a case, the N planes of one memory chip 201 are the elements in which data read can be simultaneously started. Thus, the number of elements in which data read can be simultaneously started is N.

Furthermore, if read commands are simultaneously transmissible to multiple memory chips 201, the number of elements in which data read can be simultaneously started further increases. For example, in the case of using the memory controller 100 capable of transmitting read commands simultaneously to one memory chip 201 connected to the channel #0 and another memory chip 201 connected to the channel #1, a total of four planes of the two memory chips 201 connected to the different channels will be the elements in which data read can be simultaneously started. That is, the number of elements in which data read can be simultaneously started is four.

The control circuit 102 issues a physical address designating an access destination (access destination of read command) in each of the elements in which data read can be simultaneously started, and notifies the access counter 105 of the issued physical addresses. When the access counter 105 receives the physical addresses at the same time, each of the first counter circuit 10 operates to deal with one of the physical addresses.

In the example of FIG. 5, the elements where data read can be simultaneously started are the two planes of each memory chip 201. As illustrated in FIG. 4, the access counter 105 thus includes two first counter circuits 10 so as to deal with physical addresses for the two different planes to be access destinations.

One of the two firs counter circuits 10, that is a first counter circuit 10-0 counts read accesses to Plane #0 of Chip #0 to Chip #3. The other of the two first counter circuits 10, that is, a first counter circuit 10-1 counts read accesses to Plane #1 of Chip #0 to Chip #3. The first counter circuit 10-0 and the first counter circuit 10-1 have the same hardware configuration, therefore, the hardware configuration of the first counter circuit 10-0 will be mainly described.

The first counter circuit 10-0 includes a determiner circuit 400, a block RAM (BLK_RAM) 420, a counter RAM (COUNT_RAM) 430, an update circuit 440, and a state machine (Finite State Machine: FSM) 450.

The block RAM 420 is a memory for storing plurality of physical addresses each indicating an open block. The counter RAM 430 is a memory for storing a counted value of read accesses to each open block. Hereinafter, the counted value of read accesses to each open block will be referred to simply as a counted value unless described otherwise. The block RAM 420 and the counter RAM 430 may be made up of any type of memories. For example, the block RAM 420 and the counter RAM 430 include a DRAM, an SRAM, a flip-flop, or a combination FIG. 6 is a diagram illustrating an example of information that is stored in the block R 420 and the counter RAM 430 according to the first embodiment. The block RAM 420 includes a plurality of entries each containing one physical address. The entries of the block RAM 420 are identified by entry numbers in ascending order from the head of the block RAM 420.

Likewise, the counter RAM 430 includes a plurality of entries each containing one counted value. The entries of the counter RAM 430 are identified by entry numbers in ascending order from the head of the counter RAM 430.

In the following, an entry with an entry number "i." in each of the RAMS 420 and 430 may be denoted by entry #i.

Physical addresses indicating open blocks in Planes #0 of Chip #0 to Chip #3 in each memory chip 201 are grouped, and all the physical addresses of the same group are stored in one continuous area of the block RAM 420.

For example, four physical addresses, physical address_0 to physical address_3, indicating four open blocks in Plane #0 of Chip #0 are stored in a continuous area including four continuous entries (entry #0 to entry #3) in the block RAM 420. Three physical addresses, physical address_4 to physical address_6, indicating three open blocks in Plane #0 of Chip #1 are stored in a continuous area including three continuous entries (entry #4 to entry #6) in the block RAM 420.

That is, the block RAM 420 includes four continuous areas each containing one or more physical addresses of the respective memory chips 201.

Each entry of the counter RAM 430 stores a counted value for an open block designated by a physical address stored in the entry, of the block R 420, having the same entry number as the entry of the counter RAN 430. That is, a counted value for an open block designated by a physical address stored in the entry #i of the block RAM 420 is stored in the entry #i of the counter RAM 430.

Refer back to FIG. 4. The determiner circuit 400 successively reads one or more physical addresses from the block RAM 420 and compares the read physical address with a physical address designating the destination of the read access received from the control circuit 102, to thereby determine whether the destination of the read access is an open block. That is, the determiner circuit 400 retrieves, from the one or more physical addresses stored in the block RAM 420, the same physical address as the physical address designating the destination of the read access.

To implement the operation described above, the determiner circuit 400 includes a first register group 401, a first multiplexer 402, a first adder 403, a second multiplexer 404, and a first register 405.

The first register group 401 includes a plurality of entries that is connected to different input terminals of the first multiplexer 402. The entries of the first register group 401 contain entry numbers indicating top entries of different continuous areas of the block RAM 420 and the counter RAM 430, respectively.

The first register group 401 contains an entry number of a top entry of a continuous area corresponding to Plane #0 of Chip #0, an entry number of a top entry of a continuous area corresponding to Plane #0 of Chip #1, an entry number of a top entry of a continuous area corresponding to Plane #0 of Chip #2, and an entry number of a top entry of a continuous area corresponding to Plane #0 of Chip #3.

The first multiplexer 402 receives a physical address notified from the control circuit 102 as a selection signal. Herein, the physical address is assumed to include both the chip number and the plane number. For example, a part of the physical address indicates the chip number, and another part of the physical address indicates the plane number. The first multiplexer 402 outputs the entry number of a top entry of a corresponding continuous area, in accordance with the chip number and the plane number included in the physical address as the selection signal.

An output terminal of the first multiplexer 402 is connected to one of two input terminals of the second multiplexer 404. An output terminal of the second multiplexer 404 is connected to the first register 405. A value that is stored in the first register 405 is input to the first adder 403. The first adder 403 adds one to the input value. An output of the first adder 403 is input to the other one of the two input terminals of the second multiplexer 404.

The second multiplexer 404 receives an initialization signal as a selection signal. The initialization signal is controlled by the state machine 450. During assertion of the initialization signal, the second multiplexer 404 stores the entry number output from the first multiplexer 402 in the first register 405. During negation of the initialization signal, the second multiplexer 404 overwrites the entry number in the first register 405 with the entry number to which one is added by the first adder 403. The overwrite timing for the entry number in the first register 405 will be described in detail later.

The entry number stored in the first register 405 indicates an entry to read from the block RAM 420 and the counter 430. The entry number stored in the first register 405 is input to an address input terminal of the block RAM 420 and an address input terminal of the counter RAM 430. In the following, the entry number stored in the first register 405 may be referred to as a read entry (ReadEntry).

The determiner circuit 400 further includes a second register group 406, a third multiplexer 407, a second register 408, a second adder 409, a fourth multiplexer 410, a third register 411, and a first comparator 412.

The second register group 406 includes a plurality of entries which is connected to different input terminals of the third multiplexer 407. The entries of the second register group 406 store the number of entries of different continuous areas in the block RAM 420 and the counter RAM 430.

The second register group 406 store the number of entries of a continuous area corresponding to Plane #0 of Chip #0, the number of entries of a continuous area corresponding to Plane #0 of Chip #1, the number of entries of a continuous area corresponding to Plane #0 of Chip #2, and the number of entries of a continuous area corresponding to Plane #0 of Chip #3.

As with the first multiplexer 402, the third multiplexer 407 receives a physical address notified by the control circuit 102 as a selection signal. The third multiplexer 407 outputs, in accordance with the chip number and the plane number included in the physical address being the selection signal, the number of entries of a continuous area corresponding to the plane of the memory chip 201 designated by the chip number and the plane number.

The second register 408 stores "0". The second register 408 is connected to one of two input terminals of the fourth multiplexer 410. An output of the fourth multiplexer 410 is connected to the third register 411. A value that is stored in the third register 411 is input to the second adder 409. The second adder 409 adds one to the input value. An output of the second adder 409 is input to the other one of the two input terminals of the fourth multiplexer 410.

The fourth multiplexer 410 receives an initialization signal as a selection signal. During the assertion of the initialization signal, the fourth multiplexer 410 stores the content of the second register 408 in the third register 411. During negation of the initialization signal, the fourth multiplexer 410 overwrites the content in the third register 411 with the content output from the third register 411. Overwrite timing for the content of the third register 411 will he described in detail later.

The content of the third register 411 indicates the number of increments of a read entry since the entry number of a top entry has been stored in the first register 405 as a read entry. In the following, a value stored in the third register 411 may be referred to as an entry count (EntryCnt).

The content (i.e., the entry count) of the third register 411 is input to one of two input terminals of the first comparator 412. An output terminal of the third multiplexer 407 is connected to the other one of the two input terminals of the first comparator 412.

The first comparator 412 compares the entry count input from the third register 411 with the number of entries of a continuous area input from the third multiplexer 407. When the entry count is smaller than the number of entries of the continuous area, the first comparator 412 maintains a read enable signal (ReadEn) of the block RAM 420 in an asserted state. When the entry count is equal to or greater than the number of entries of the continuous area, the first comparator 412 maintains the read enable signal (ReadEn) of the block RAM 420 in a negated state.

The determiner circuit 400 further includes a second comparator 413. An output of the block RAM 420 is input to one of two input terminals of the second comparator 413. A physical address designating a destination of a read access is notified from the control circuit 102 to the other one of the two input terminals of the second comparator 413.

During the assertion of the read enable signal (ReadEn) for the block RAM 420, the block RAM 420 outputs the value, i.e., the physical address, from the entry designated by an entry number input from the address input terminal. The second comparator 413 compares the physical address from the block RAM 420 with the physical address notified by the control circuit 102.

When the two physical addresses coincide with each other, the second comparator 413 maintains a read enable signal (ReadEn) for the counter RAM 430 in an asserted state. When the two physical addresses are different from each other, the second comparator 413 maintains the read enable signal (ReadEn) for the counter RAM 430 in a negated state.

When the physical address from the block RI 420 coincides with the physical address the destination of the read access, the second comparator 413 asserts the read enable signal (ReadEn) for the counter RAM 430, and the counter RAM 430 outputs a counted value for the open block indicated by the physical address.

The determiner circuit 400 having the above configuration operates in the following manner.

That is, upon receiving a notification of physical address from the control circuit 102, the determiner circuit 400 selects, through the first multiplexer 402 and the third multiplexer 407, the entry number of the top entry of a continuous area corresponding to the plane in the memory chip 201 including the location designated by the physical address, and the number of entries in the continuous area.

The determiner circuit 400 thereby identifies a continuous area to search, from among the entries of the block RAM 420. The entry number output from the first multiplexer 402 refers to the top entry of the continuous area to search. The number of entries output from the third multiplexer 407 is the number of entries of the continuous area to search.

When notified of the physical address from the control circuit 102, the state machine 450 asserts the initialization signal, as described later. The entry number of the top entry of the continuous area to search is thereby stored in the first register 405 as a read entry, and zero is stored in the third register 411 as the entry count.

When the entry count is smaller than the number of entries of the continuous area to search, the first comparator 412 maintains the read enable signal for the block RAM 420 in an asserted state, which maintains the block RAM 420 in a readable state. In this case, a physical address is read from an entry of the block RAM 420 indicated by the read entry, and compared by the second comparator 413 with the physical address notified by the control circuit 102.

The initialization signal is negated after the entry number of the top entry of the continuous area to search is stored as the read entry and zero is stored as the entry count. Then, the second multiplexer 404 select the input terminal connected to the first adder 403, and the fourth multiplexer 410 selects the input terminal connected to the second adder 409.

Then, the read entry and the entry count are incremented. If the incremented entry count is still smaller than the number of entries of the continuous area, a physical address, that is, an entry following the previously read entry is read from the entry of the block RAM 420 indicated by the read entry, and compared by the second comparator 413 with the physical address which is notified by the control circuit 102 in the same manner described above.

Thus, the determiner circuit 400 reads the physical addresses in order from the head of the continuous area to search, and compares the read physical address with the physical address notified by the control circuit 102. The determiner circuit 400 can repeatedly read the physical addresses while incrementing the read entry, until the physical address read from the continuous area to search coincides with the physical address notified by the control circuit 102, or the last entry of the continuous area to search is subjected to the read operation. That is, by sequentially reading physical addresses from the continuous area corresponding to the plane of the memory chip 201 including the location indicated by the physical address notified by the control circuit 102, the determiner circuit 400 searches the continuous area for the same physical address as the physical address notified by the control circuit 102.

The physical address read from the continuous area matching the physical address notified by the control circuit 102 signifies that the block including the location indicated by the physical address notified by the control circuit 102, that is, the block being the destination of the read access, is determined to be an open block.

When the physical address read from the continuous area coincides with the physical address notified by the control circuit 102, the determiner circuit 400 asserts the read enable signal for the counter RAM 430 through the second comparator 413. Then, the counter RAM 430 receives the read entry at the address input terminal and outputs the counted value contained in the read entry. The counted value output from the counter RAM 430 corresponds to a counted value for the block being the destination of the read access and determined to be an open block.

The update circuit 440 acquires and increments (i.e., adds one to) the counted value from the counter RAM 430, and writes back the incremented counted value to the counter RAM 430. That is, the update circuit 440 overwrites the counted value before increment with the counted value after increment.

The counter RAM 430 may be configured to receive a write enable signal (WriteEn). For example, the write enable signal for the counter RAM 430 may be asserted in response to the assertion of the read enable signal for the counter RAM 430, and the update circuit 440 may write the incremented counted value to the counter RAM 430 while the write enable signal is being asserted.

The update circuit 440 further outputs the incremented counted value to the interrupt generation circuit 30.

The state machine 450 controls the initialization signal and the block-searching (BLK-searching) signal, for example. The block-searching signal represents a signal indicating whether the first counter circuit 10 is executing a certain operation or not. Details of the state machine 450 will be explained later.

Having the above configuration, the first counter circuit 10-0 can increment, when the destination of a read access is the open block in Plane #0, the counted value for the open block stored in the counter RAM 430, and output the incremented counted value.

The first counter circuit 10-1 has the same hardware configuration as that of the first counter circuit 10-0. However, the first counter circuit 10-1 additionally includes a configuration for Plane #1.

Specifically, in the first counter circuit 10-1, the block 420 stores physical addresses indicating open blocks in Planes #1 of Chip #0 to Chip #3, and the counter RAM 430 stores counted values for the open blocks in Planes #1 of Chip #0 to Chip #3. The first register group 401 of the first counter circuit 10-1 stores the entry number of a top entry of each continuous area in the block RAM 420 and the counter RAM 430. The second register group 406 of the first counter circuit 10-1 stores the number of entries of the continuous area for each of the continuous areas of the block RAM 420 and the counter RAM 430 of the first counter circuit 10-1. The rest of the configuration thereof is the same as that of the first counter circuit 10-0.

When the destination of a read access is an open block in Plane #1, the first counter circuit 10-1 can increment the counted value for the open block stored in the counter RAM 430 of the first counter circuit 10-1, and output the incremented counted value.

The second counter circuit 20 includes a third register group 461 in which the counted value is stored, aside from the first counter circuits 10. When receiving a notification of a next physical address from the control circuit 102 while the first counter circuit 10 is executing a certain operation, the second counter circuit 20 increments the counted value stored in the third register group 461. That is, the second counter circuit 20 counts the number of read accesses that the first counter circuit 10 has failed to count.

Specifically, the second counter circuit 20 includes a demultiplexer 460, the third register group 461, a fifth multiplexer 462, a third adder 463, and a,sixth multiplexer 464.

The third register group 461 includes a plurality of entries which is connected to different output terminals of the demultiplexer 460 and different input terminals of the fifth multiplexer 462. The number of read access that the first counter circuit 10 has failed to count is stored for each plane of each memory chip 201. The number of read accesses counted by the second counter circuit 20, which the first counter circuit 10 failed to count, is referred to as a drop count (DropCnt).

The demultiplexer 460 and the fifth multiplexer 462 receives a notification of a physical address from the control circuit 102 as a selection signal. The demultiplexer 460 and the fifth multiplexer 462 select an entry corresponding to the chip number and the plane number included in the physical address being the selection signal. This enables input and output from and to the entry containing a drop count for the plane of the memory chip 201 being the access destination of a read access.

The fifth multiplexer 462 outputs the value from the selected entry to one of two input terminals of the sixth multiplexer 464.

The fifth multiplexer 462 also outputs the value to the third adder 463. The third adder 463 adds one to the input value and outputs it to the other one of the two input terminals of the sixth multiplexer 464.

The sixth multiplexer 464 receives a block-searching signal as a selection signal. The block-searching signal represents a signal indicating whether or not the first counter circuit 10 is executing a certain operation. The block-searching signal is controlled by the state machine 450. During assertion of the block-searching signal, that is, while the first counter circuit 10 is executing a certain operation, the sixth multiplexer 464 selects the input terminal connected to the third adder 463.

Then, the third adder 463 receives the drop count for the plane of the memory chip 201 being the destination of the read access through the fifth multiplexer 462, and adds one to the drop count. The third register group 461 is overwritten with the added drop count through the sixth multiplexer 464 and the demultiplexer 460.

During negation of the block-searching signal, that is, while the first counter circuit 10 is not executing a certain operation, the sixth multiplexer 464 receives the drop count for the plane of the memory chip 201 being the destination of the read access without passing through the third adder 463, and outputs it from the output terminal. In this case, the drop count stored in each entry of the third register group 461 is not changed.

The interrupt generation circuit 30 calculates a sum of the counted value output from the first counter circuit 10 and the drop count output from the second counter circuit 20, to output an interrupt signal INT in accordance with a result of comparison between the sum and a certain threshold.

Specifically, the interrupt generation circuit 30 includes a fourth adder 470, a fourth register 471, and a third comparator 472.

The fourth adder 470 adds the incremented counted value from the update circuit 440 of the first counter circuit 10 and the drop count from the sixth multiplexer 464 of the second counter circuit 20. The fourth adder 470 outputs the resultant to one of two input terminals of the third comparator 472.

The fourth register 471 stores the threshold for determining whether to output the interrupt signal. The fourth register 471 is connected to the other one of the two input terminals of the third comparator 472.

The third comparator 472 compares the sum of the two counted values calculated by the fourth adder 470 with the threshold stored in the fourth register 471. If the sum calculated by the fourth adder 470 is greater than the threshold, the third comparator 472 outputs the interrupt signal INT. If the sum calculated by the fourth adder 470 does not exceed the threshold, the third comparator 472 refrains from outputting the interrupt signal INT.

The control circuit 02 receives the interrupt signal INT from the third comparator 472.

The interrupt generation circuit 30 is an exemplary output circuit that outputs a notification based on a counted value from the first counter circuit 10. The interrupt signal INT is an example of the notification. The interrupt generation circuit 30 may output the notification in a different manner, instead of using the interrupt signal INT.

FIG. 4 shows an example of implementing one fourth adder 470 and one third comparator 472. Alternatively, each first counter circuit 10 may include the fourth adder 470 and the third comparator 472. In this case, each fourth adder 470 is connected to one first counter circuit 10 to add the counted value from the first counter circuit 10 and the drop count from the second counter circuit 20. Each third comparator 472 is connected to one fourth adder 470 to output an interrupt signal INT when the sum calculated by the fourth adder 470 exceeds the threshold stored in the fourth register 471. Thus, each of the first counter circuits 10 can determine output or non-output of the interrupt signal INT.

The control circuit 102 observes progress of an access to the NAND memory 200. Upon detection of an interrupt signal INT after the transmission of a read command to the NAND memory 200, the control circuit 102 recognises that the number of read accesses to the open block being the destination of the read access based on a read command exceeds a certain threshold, that is, the threshold stored in the fourth register 471. The control circuit 102 then determines that a refresh operation to data stored in the open block is needed. That is, the control circuit 102 determines execution of a transcription operation to the open block as the transcription source.

In the refresh operation, the control circuit 102 transcribes, to another open block, all the data stored in the open block subjected to read accesses over the certain threshold, and changes the open block to a free block. The data stored in the open block of interest is thereby saved in another open block, thereby recovering reliability of the data.

Next, the state machine 450 will be described. Here, the state machine 450 of the first counter circuit 10-0 will be described.

FIG. 7 is a diagram illustrating an example of state transition of the state machine 450 according to the first embodiment. As illustrated in the FIG. 7, the states of the state machine 450 are an idle state (IDLE), an initialization state (INIT), a searching state (SRCH), and an updating state (UPDATE).

The idle state is a state where the first counter circuit 10-0 is ready to start operation in response to a notification of a physical address from the control circuit 102. When receiving the physical address from the control circuit 102 in the idle state, the state machine 450 transitions from the idle state to the initialization state.

The initialization state is a state of the state machine 450 immediately after the notification of the physical address from the control circuit 102. At the time of transitioning from the idle state to the initialization state, the state machine 450 asserts the initialization signal.

The state machine 450 may negate the initialization signal and transition from the initialization state to the idle state or the searching state.

Specifically, with no output from the first multiplexer 402 and the third multiplexer 407, the state machine 450 returns from the initialization state to the idle state. In a case of Plane #1 being the access destination, for example, the first multiplexer 402 and the third multiplexer 407 of the first counter circuit 10-0 outputs none, thus, the state machine 450 returns to the idle state.

When the first multiplexer 402 outputs an entry number and the third multiplexer 407 outputs the number of entries, the state machine 450 transitions from the initialisation state to the searching state. If Plane #0 is the access destination and the memory chip 201 as the access destination includes an open block, for example, the first multiplexer 402 outputs an entry number and the third multiplexer 407 outputs the number of entries.

The searching state is a state where the determiner circuit 400 is successively reading physical addresses from a continuous area to search, and comparing a read physical address with the physical address notified by the control circuit 102. Hereinafter, such an operation will be referred to as a search operation.

The state machine 450 transitions from the searching state to the updating state when the determiner circuit 400 succeeds in the search for the physical address notified by the control circuit 102, that is, when the same physical address as the physical address notified by the control circuit 102 is stored in the continuous area.

When the determiner circuit 400 fails in the search for the physical address notified by the control circuit 102, that is, when the same physical address as the physical address notified by the control circuit 102 is not stored in the continuous area, the state machine 450 transitions from the searching state to the idle state.

The updating state is a state where the update circuit 440 is updating the counted value stored in the counter RAM 430. Hereinafter, such an operation will be referred to as an update operation. Upon completion of the update operation, the state machine 450 transitions to the idle state.

While the first counter circuit 10 is executing a certain operation, the state machine 450 maintains the block-searching signal in an asserted state. While the first counter circuit 10 is not executing the certain operation, the state machine 450 maintains the block-searching signal in a negated state.

In the first embodiment, the certain operation includes the search operation and the update operation. That is, while the determiner circuit 400 is executing the search operation or the update circuit 440 is executing the update operation, the state machine 450 maintains the block-searching signal in the asserted state. While the determiner circuit 400 is not executing the search operation, and the update circuit 440 is not executing the update operation, the state machine 450 maintains the block-searching signal in the negated state.

Figure 8:
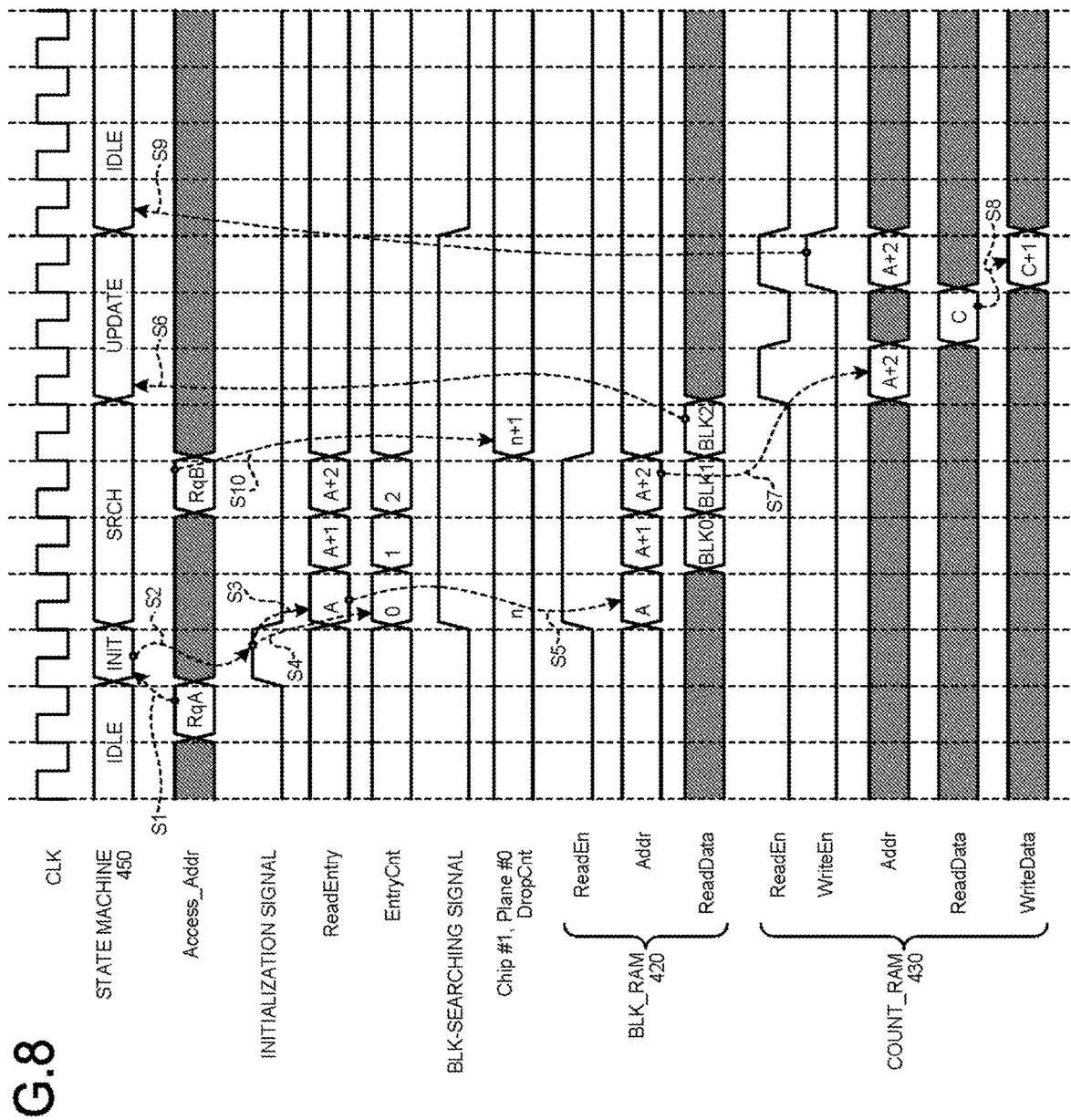
FIG. 8 is a timing chart illustrating an example of transition of various signals, including a state of an initialization signal and a block-searching signal, which are controlled by the state machine according to the first embodiment.

FIG. 8 is a timing chart illustrating an example of transition of various signals including the initialization signal and the block-searching signal, which are controlled by the state machine 450 according to the first embodiment. FIG. 8 illustrates, from the top, a clock signal for driving the access counter 105, a state signal of the state machine 450, a notification from the control circuit 102 (Access_Addr), an initialization signal, a read entry, an entry count, a block-searching signal, a drop count for Plane #0 of Chip #1 stored in the third register group 461 (DropCnt), a read enable signal for the block RAM 420 (ReadEn), an address to the address input terminal of the block RAM 420 (Addr), a physical address from the block RAM 420 (ReadData), a read enable signal for the counter RAM 430 (ReadEn), a write enable signal for the counter RAM 430 (WriteEn), an address to the address input terminal of the count 430 (Addr), a counted value from the counter RAM 430 (ReadData), and a counted value to the counter RAM 430 (WriteData).

The state machine 450 is initially placed in the idle state. When the determiner circuit 400 receives a notification of a physical address (RqA) from the control circuit 102, the state machine 450 transitions from the idle state to the initialization state (S1), and asserts the initialization signal (S2).

RqA denotes a physical address designating a location in Plane #0 of Chip #0 of an open block specified by a physical address BLK2.

Upon assertion of the initialization signal, an entry number (given as "A") of the top entry of the continuous area corresponding to the plane of the memory chip 201 indicated by the physical address notified by the control circuit 102 is stored in the first register 405 as a read entry (S3). Also, zero is stored in the third register 411 as an entry count (S4). All of the entries (here, given as three entries) of the continuous area are thus selected.

The read entry is supplied to the address input terminal of the block RAM 420 (S5), and the physical address is output from the entry indicated by the supplied read entry.

When receiving the next clock, the state machine 450 negates the initialization signal, asserts the block-searching signal, and transitions to the searching state. In the searching state, the read entry and the entry count are incremented every time the clock is supplied. Then, every time the clock is supplied, a physical address is output from the entry of the block RAM 420 indicated by the read entry.

For example, physical addresses are sequentially read from an entry #A, an entry #A+1, and an entry #A+2 in the block RAM 420. When the physical address "BLK2" is read from the entry #A+2, the second comparator 413 detects the match between the physical address "BLK2" read from the entry #A+2 and the physical address "BLK2" indicating the block being the access destination. Then, the state machine 450 transitions from the searching state to the updating state (S6).

In the updating state, second comparator 413 asserts the read enable signal for the counter RAM 430. The entry number "A+2" of the entry from which the physical address "BLK2" has been read is supplied to the address input terminal of the counter RAM 430 (S7). Then, a counted value (given as "C") is output from the entry #A+2 of the counter RAM 430.

After the counted value "C" is read, the state machine 450 maintains the write enable signal for the counter RAM 430 in the asserted state, for example, for a period of one clock. At this timing, the update circuit 440 overwrites a new counted value "C+1", one added to the counted value "C", to the entry #A+2 of the counter RAM 430 (S8). The counted value for the open block indicated by the physical address "BLK2" is thereby incremented.

Upon completion of overwriting the entry #A+2 of the counter RAM 430, the write enable signal is placed in the negated state, and the state machine 450 transitions from the updating state to the idle state (S9). The state machine 450 negates the block-searching signal at the time of transitioning from the updating state to the idle state.

When notified of a new physical address (RqB) from the control circuit 102 during assertion of the block-searching signal, the second counter circuit 20 processes the notification. If RqB indicates a location in Plane #0 of Chip #1, the second counter circuit 20 increments the drop count for Plane #0 of Chip #1 (S10).

The temporal transition of the signals and the values illustrated in FIG. 8 is merely exemplary and not limited to such an example.

Next, the operation of the access counter 105 according to the first embodiment will be described. FIG. 9 is a flowchart illustrating exemplary operation of the access counter 105 according to the first embodiment.

When the memory controller 100 performs a read access to the NAND memory 200 (YES in S100), the access counter 105 opera depending on assertion or negation of the block-searching signal (S101).

During negation of the block-searching signal (NO in S101), that is, neither in the search operation nor in the update operation, the access counter 105 specifies the entry number of the top entry of a continuous area corresponding to the plane of the memory chip 201 including the destination of the read access, and the number of entries of the continuous area (S102).

The search operation corresponds to the operation from S102 to S107, for example. The update operation corresponds to the operation from S108 to S112, for example.

After S102, the access counter 105 sets the entry count to zero, and sets the entry number specified in S102 as the read entry (S103).

If the entry count is smaller than the number of entries specified in S102 (YES in S104), the access counter 105 reads a value, that is, a physical address from a location in the block RAM 420 indicated by the read entry (S105).

When the value read in S105 and the physical address designating the destination of the read access do not coincide with each other (NO in S106), the access counter 105 increments the entry count and the read entry by one (S107), and re-executes the operation in S104.

When the value read in S105 and the physical address designating the destination of the read access coincide with each other (YES in S106), that is, the block being the destination of the read access is an open block, the access counter 105 reads a value, that is, a counted value for the open block from the location in the counter RAM 430 indicated by the read entry (S108). The access counter 105 then adds one to the read value (S109).

When the sum of the value obtained in S109 and the drop count is greater than threshold stored in the fourth register 471 (YES in S110), the access counter 105 outputs an interrupt signal INT (S111). When receiving the interrupt signal INT, the control circuit 102 can determine to execute the transcription (refresh operation) from the block being the destination of the read access.

When the sum of the value obtained in S109 and the drop count do nut exceed the threshold stored in the fourth register 471 (NO in S110) or after S111, the access counter 105 overwrites the location in the counter RAM 430 indicated by the read entry with the value obtained in S109 (S112). This ends the operation of the access counter 105.

When the entry count is not smaller than the number of entries specified in S102 (NO in S104), that is, the block being the destination of the read access is not an open block, the access counter 105 ends the operation.

When the memory controller 100 performs a read access to the NAND memory 200 (YES in S100), and the block-searching signal is in the asserted state (YES in S101), that is, during the search operation or the update operation, the second counter circuit 20 increments the drop count for the plane and the memory chip 201 including the destination of the read access (S113). This ends the operation of the access counter 105.

As described above, according to the first embodiment, the access counter 105 includes the block RAM 420 that stores multiple addresses each designating an open block, and the counter RAM 430 that stores a counted value for each open block. At the time of read access to the NAND memory 200, the determiner circuit 400 determines whether or not the block being the destination of the read access is an open block, by sequentially reading addresses from the lock RAM 420 and comparing the read addresses with the address of the destination of the read access. When the block being the destination of the read access is an open block, the update circuit 440 increments the counted value for the block.

As an exemplary comparison with the first embodiment, assumed that the access counter may include, for each open block, a comparator that compares an address of an open block with an address of an access destination of a read access, and an adder that increments a counted value. In such configuration, the numbers of comparators and adders are increased in accordance with the number of open blocks, resulting in increase in the circuit area of the access counter.

In contrast, according the first embodiment, the access counter include only one comparator (second comparator 413) and only one adder (update circuit 440) to count the number of read accesses to a plurality of open blocks the addresses of which are stored in the block RAM 420.

That is, according to the first embodiment, the number of comparators and adders can be reduced from that of the comparative example. Thus, according to the first embodiment, the number of read accesses can be counted by a downsized circuit.

In the first embodiment, the determiner circuit 400 retrieves a physical address of a block being a destination of a read access from among a plurality of physical addresses stored in the block RAM 420. This may take longer time required for each read access than the comparative example.

If the required time exceeds the time from the execution of a read access to a next read access, the first counter circuit 10 cannot count the number of subsequent read accesses.

In view of this, the access counter 105 is provided with the second counter circuit 20 that increments the drop count upon every read access during execution of a certain operation in the first counter circuit 10.

This makes it possible for the second counter circuit 20 to count the number of read accesses that the first counter circuit 10 has failed, preventing failure in counting read accesses.

The second counter circuit 20 counts the drop count for each plane of the memory chip 201. The second counter circuit 20 may count the drop count for each memory chip 201 or for each plane. The second counter circuit 20 may count one drop count for all the memory chips 201. In other words, granularity of a storage area for which the drop count is counted, that is, the size of a storage area corresponding to one drop count, can be freely determined.

In the first embodiment, the interrupt generation circuit 30 outputs an interrupt signal INT on the basis of a result of comparison between the sum of the number of read accesses counted by the first counter circuit 10 and the drop count counted by the second counter circuit 20, and the threshold stored in the fourth register 471.

Thereby, the interrupt generation circuit 30 can output the interrupt signal INT, considering read accesses that the first counter circuit 10 has failed to count, if any.

The finer the granularity of a storage area for which the drop count is counted is, the closer to the number of actual read accesses to each open block the value calculated by the fourth adder 470 is. That is, the number of read accesses to each open block is more accurately countable.

Furthermore, in the first embodiment, the control circuit 102 performs refresh operation to an open block when an interrupt signal INT is output.

This makes it possible to recover the reliability of data written in the open block before the reliability falls to or below a certain level.

The control circuit 102 does not necessarily perform refresh operation to an open block upon input of an interrupt signal INT. The control circuit 102 may include different criteria for determining whether to perform refresh operation to an open block, and may use the input of the interrupt signal INT as one of the criteria.

The interrupt generation circuit 30 does not necessarily add a drop count to the number of read accesses counted by the first counter circuit 10. The interrupt generation circuit 30 may output an interrupt signal INT according to a result of the comparison between only the number of read accesses counted by the first counter circuit 10 and the threshold stored in the fourth register 471.

In the first embodiment, the physical addresses designating open blocks are grouped for each plane of each memory chip 201. In other words, open blocks are sorted into groups to be specified by chip numbers and plane numbers. The block RAM 420 includes continuous areas corresponding to the groups. The determiner circuit 400 specifies a continuous area corresponding to a plane of the memory chip 201 including a block being the destination of a read access, from among the continuous areas, and reads the physical addresses from the continuous area sequentially from the top.

This can shorten the length of time taken to retrieve the physical address of a block being the destination of a read access, in comparison with sequentially reading physical addresses from the head of the block RAM 420.

Furthermore, in the first embodiment, the counter RAM 430 stores, in the entry #i, the counted value for an open block indicated by a physical address stored in the entry #i of the block RAM 420. That is, with respect to each open block, the storage location of a physical address in the block RAM 420 and the storage location of a counted value in the counter RAM 430 statically correspond to each other.

The storage location of the physical address of an open block is associated with the storage location of a counted value for each open block, which facilitates the management of the relationship between the two storage locations.

The first embodiment has not described a state transition of the block. The control circuit 102 may execute the state transition of the block, for example. In this case, the control circuit 102 updates the content of the corresponding entries of the block RAM 420 and the counter RAM 430, at the time of changing a free block to an open block or an open block to an active block.

Specifically, when changing the state of a certain block (referred to as a first block) of a plane of a certain memory chip 201 from open to active, and changing the state of another block (referred to as a second block) of the same plane of the same memory chip 201 from free to open, the control circuit 102 updates the content of the entry, of the block RAM 420, storing the physical address of the first block, with the physical address of the second block. The control circuit 102 also overwrites the entry, of the counter RAM 430, storing the counted value for the first block, with zero. This makes it possible to count the number of read accesses to the second block designated as a new open block.

The first embodiment has described the open block as the subject of the read access count, by way of example. The subject of the read access count is not limited thereto. A designer may select any storage area as the subject of the read access count.

Second Embodiment

In the first embodiment, the state machine 450 maintains the block-searching signal in an asserted state during either the search operation or the update operation, and maintains the block-searching signal in a negated state during neither the search operation nor the update operation. Thus, during one of the search operation and the update operation, the second counter circuit 20 counts a new read access as the drop count.

During the search operation, the state machine 450 may maintain the block-searching signal in an asserted state, and not during the search operation, the state machine 450 may maintain the block-searching signal in a negated state.

According to such a configuration, the determiner circuit 400 can start the search operation for a new read access while the update circuit 440 is executing the update operation for a preceding read access.

That is, the first counter circuit 10 can count successive read accesses by pipeline processing.

FIG. 10 is a sequence diagram illustrating exemplary operation of the access counter 105 according to a second embodiment.

First, when receiving a notification of a physical address from the control circuit 102 (S200), the determiner circuit 400 reads a physical address from a continuous area of the block RAM 420 (S201). The determiner circuit 400 performs the operation in S201 at least once.

When the determiner circuit 400 receives the same physical address from the block RAM 420 as the physical address notified by the control circuit 102 (S202), the update circuit 440 reads a counted value from the location in the counter RAM 430 indicated by a read entry (S203, S204, and S205).

Then, the update circuit 440 increments the counted value, and writes the incremented counted value to the counter RAM 430 (S206).

Upon receiving the notification of a next physical address from the control circuit 102 even while the update circuit 440 is in operation (S204 to S206), the determiner circuit 400 can start the search operation for the next physical address.

That is, when receiving the next physical address (S210), the determiner circuit 400 performs, in S211 to S213, the same operations as those in S201 to S203. Then, the update circuit 440 can perform the update operation for the next physical address (S214 to S216).

Upon receipt of a next physical address (S220) while the determiner circuit 400 is searching for the next physical address (S211 to S212), the second counter circuit 20 increments a corresponding drop count (S221).

As described above, in the second embodiment, in response to a read access while determiner circuit 400 is searching (i.e., in operation), the second counter circuit 20 increments the drop count. While the determiner circuit 400 is not searching (i.e., not in operation), and the update circuit 440 is updating (i.e., in operation), the second counter circuit 20 does not increment the drop count.

Thereby, the first counter circuit 10 can count successive read accesses by pipeline processing, and he prevented from failure in counting.

If the sum of the counted value for an open block and the drop count exceeds a certain threshold, the interrupt generation circuit 30 transmits the interrupt signal INT (S230).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile first memory including a plurality of first storage areas; and
   at least one first counter circuit including:
      a second memory configured to store a plurality of first addresses, each of the first addresses being address information of a second storage area, the second storage area being a first storage area in a first state;
      a third memory configured to store a first counted value for the second storage area;
      a determiner circuit configured to read, at a time of a read access to the non-volatile first memory, at least one of the first addresses from the second memory and compare a second address with a third address to determine whether or not a third storage area is in the first state, the second address being a first address read from the second memory, the third address being address information indicating a location of the third storage area, the third storage area being a first storage area to be a destination of the read access; and
      an update circuit configured to increment, for the third storage area, the first counted value stored in the third memory, when the determiner circuit determines that the third storage area is in the first state.

2. The memory system according to claim 1, wherein each of the first storage areas is a block, and
the first state is a state of the block in which an available area remains.

3. The memory system according to claim 1, further comprising
an output circuit configured to output a notification on the basis of the first counted value for the third storage area.

4. The memory system according to claim 3, further comprising
a control circuit configured to determine, on the basis of the notification, whether or not to transcribe content of the third storage area to one of the first storage areas different from the third storage area.

5. The memory system according to claim 1, further comprising
a control circuit configured to issue the third address for each of two or more of read accesses that simultaneously start, wherein
the number of the first counter circuits is equal to the number of read accesses that simultaneously start.

6. The memory system according to claim 1, further comprising
a second counter circuit configured to increment a second counted value, upon every read access to the non-volatile first memory while the first counter circuit is executing a certain operation.

7. The memory system according to claim 6, further comprising
an output circuit configured to calculate a third counted value and output a notification on the basis of the third counted value, the third counted value being a sum of the first counted value incremented by the update circuit and the second counted value.

8. The memory system according to claim 7, further comprising a control circuit configured to determine, on the basis of the notification, whether or not to transcribe content of the third storage area to one of the first storage area different from the third storage area.

9. The memory system according to claim 6, wherein
a case in which the first counter circuit is executing the certain operation corresponds to a case in which the determiner circuit is in operation, and
a case in which the first counter circuit is not executing the certain operation corresponds to a case in which the determiner circuit is not in operation and the update circuit is in operation.

10. The memory system according to claim 1, wherein
the first storage areas are sorted into a plurality of groups,
the second memory includes a plurality of continuous areas respectively corresponding to the groups, each of the continuous areas stores one or more first addresses indicating the second storage area or areas of the corresponding groups, and
the determiner circuit is configured to specify a continuous area corresponding to a group including the third storage area, from among the continuous areas, and sequentially read the first addresses from the specified continuous area from a head of the specified continuous area.

11. The memory system according to claim 1, wherein
with respect to each second storage area, a storage location of the first address in the second memory and a storage location of the first counter value in the third memory correspond to each other.

12. The memory system according to claim 2, further comprising
a control circuit configured to cause the first storage area to transition from a second state different from the first state to the first state, and cause the first storage area to transition from the first state to third state different from the first state, wherein
the control circuit updates content of the second memory and the third memory, when causing the first storage area to transition from the second state to the first state or causing the first storage area to transition from the first state to the third state.

13. The memory system according to claim 7, wherein
the non-volatile first memory includes a plurality of fourth storage areas, each of the fourth storage areas being larger in sire than one first storage area, and
the second counter circuit is configured to manage the second counted value for each of the fourth storage areas.

* * * * *